United States Patent
Ma et al.

(10) Patent No.: US 11,011,703 B2
(45) Date of Patent: May 18, 2021

(54) SEMICONDUCTOR DEVICE AND MANUFACTURING METHOD THEREOF

(71) Applicant: SiEn (QingDao) Integrated Circuits Co., Ltd, Shangdong (CN)

(72) Inventors: Qiang Ma, Shangdong (CN); Yanlei Ping, Shangdong (CN); Tianhui Li, Shangdong (CN)

(73) Assignee: SiEn (QingDao) Integrated Circuits Co., Ltd., Shangdong (CN)

( * ) Notice: Subject to any disclaimer, the term of this patent is extended or adjusted under 35 U.S.C. 154(b) by 0 days.

(21) Appl. No.: 16/681,893

(22) Filed: Nov. 13, 2019

(65) Prior Publication Data
US 2020/0259082 A1    Aug. 13, 2020

(30) Foreign Application Priority Data
Nov. 14, 2018  (CN) .......................... 201811350002.8

(51) Int. Cl.
*H01L 45/00* (2006.01)
*G11C 5/02* (2006.01)
*G11C 13/00* (2006.01)

(52) U.S. Cl.
CPC .......... *H01L 45/1253* (2013.01); *G11C 5/025* (2013.01); *G11C 13/0007* (2013.01); *H01L 45/146* (2013.01); *H01L 45/1608* (2013.01)

(58) Field of Classification Search
CPC ............ H01L 45/1253; H01L 45/1608; H01L 45/146; H01L 27/2463; G11C 5/025; G11C 13/0007
See application file for complete search history.

(56) References Cited

U.S. PATENT DOCUMENTS

| 8,395,139 B1 * | 3/2013 | Ho ....................... H01L 27/2454 257/4 |
| 8,816,432 B2 * | 8/2014 | Kim ..................... H01L 27/2454 257/331 |
| 9,431,402 B2 * | 8/2016 | Ji ......................... H01L 29/7827 |
| 10,283,710 B2 * | 5/2019 | Kikuchi .............. H01L 27/2454 |
| 2015/0340406 A1 | 11/2015 | Jo |
| 2018/0315794 A1 | 11/2018 | Kamalanathan et al. |

OTHER PUBLICATIONS

1st Office Action dated Dec. 20, 2019 for TW application 108126293. pp. 1-5.

* cited by examiner

*Primary Examiner* — William Coleman
(74) *Attorney, Agent, or Firm* — Chen Yoshimura LLP

(57) ABSTRACT

This invention provides a semiconductor device and a manufacturing method thereof. The semiconductor device comprises a substrate; a bitline, suspended on the substrate; a bottom electrode, wrapped around the bitline; a resistive layer, wrapped around the bottom electrode; a top electrode, wrapped around the resistive layer; and a wordline electrode, disposed around the top electrode and connected to the top electrode.

18 Claims, 7 Drawing Sheets

SEMICONDUCTOR DEVICE AND MANUFACTURING METHOD THEREOF

CROSS-REFERENCE TO RELATED APPLICATIONS

This application claims priority to P.R.C. Patent Application No. 201811350002.8 titled "semiconductor device and manufacturing method thereof," filed on Nov. 14, 2018, with the State Intellectual Property Office of the People's Republic of China (SIPO).

TECHNICAL FIELD

The present disclosure relates to the design and manufacture of integrated circuits, and particularly, to a semiconductor device structure with multi-layers alternately stacked on the substrate and a method for manufacturing the same.

BACKGROUND

As technology advances, there is a significant challenge for existing memory in terms of durability, program/erase (P/E) voltage, speed, reliability, variability, and non-volatile data density. RRAM (Resistive Random Access Memory) is widely used due to its excellent scalability, speed, durability, reliability and data retention capabilities. However, the existing RRAM has problems such as poor uniformity of the resistance state distribution and small storage capacity Based on the above, it is necessary to provide a semiconductor device structure that can improve the above problem.

SUMMARY

In light of the abovementioned problems, an object of the present disclosure is to provide a semiconductor device and a manufacturing method thereof, which can solve the problem of poor uniformity of resistance state distribution and small storage capacity for the RRAM in the prior art.

An objective of the present invention is to provide a semiconductor device. The semiconductor device may comprise a substrate; a bitline, suspended on the substrate; a bottom electrode, wrapped around the bitline; a resistive layer, wrapped around the bottom electrode; a top electrode, wrapped around the resistive layer; and a wordline electrode, disposed around the top electrode and connected to the top electrode.

In accordance with some embodiments, the bitline is a nanosheet.

In accordance with some embodiments, the material of the bitline comprises silicon-on-insulator, and the bitline has a thickness of 10 nm to 100 nm.

In accordance with some embodiments, the material of the bottom electrode comprises at least one of titanium nitride (TiN), tantalum nitride (TaN), tungsten (W) and platinum (Pt), and the bottom electrode has a thickness of 3 nm to 30 nm.

In accordance with some embodiments, the material of the resistive layer comprises at least one of hafnium oxide ($HfO_x$), tantalum oxide ($TaO_x$) and tungsten oxide ($WO_x$), and the resistive layer has a thickness of 30 nm to 100 nm.

In accordance with some embodiments, the material of the top electrode comprises at least one of titanium nitride (TiN), tantalum nitride (TaN), tungsten (W) and platinum (Pt), and the top electrode has a thickness of 3 nm to 30 nm.

In accordance with some embodiments, the bitline has a cross-sectional shape of a rounded rectangle.

In accordance with some embodiments, the bottom electrode, the resistive layer and the top electrode disposed between the wordline electrode and the bitline compose a variable resistance element, wherein the variable resistance element, the bitline at the inner side thereof and the wordline electrode at the outer side thereof compose a variable resistance memory unit; the semiconductor device comprises a plurality of bitlines spaced apart from each other and a plurality of wordline electrodes spaced apart from each other, wherein the pluralities of wordline electrodes are extended along an arranged orientation of the pluralities of bitlines, such that the variable resistance elements around the bitlines are connected one by one in series.

In accordance with some embodiments, the semiconductor device comprises at least two variable resistance memory units stacked up on the substrate, and a gap between the two adjacent variable resistance memory units.

In accordance with some embodiments, the semiconductor device further comprises a dielectric layer disposed between the variable resistance memory units stacked up on the substrate.

In accordance with some embodiments, the semiconductor device further comprises an isolation layer disposed on a surface of the substrate and between the variable resistance memory unit and the substrate.

Another objective of the present invention is to provide a manufacturing method of the semiconductor device. The manufacturing method comprises steps of: providing a substrate; forming sacrificial layers and bitline material layers alternately stacked on the substrate from bottom to top sequentially; etching the sacrificial layers and the bitline material layers to from a fin-shaped structure having sacrificial units and bitline units alternately stacked from bottom to top sequentially; etching selectively the sacrificial units in the fin-shaped structure to obtain a suspended bitline; forming a bottom electrode wrapped around the bitline; forming a resistive layer wrapped around the bottom electrode; forming a top electrode wrapped around the resistive layer; and forming a wordline electrode disposed around the top electrode and connected to the top electrode.

In accordance with some embodiments, the sacrificial layers comprise a buried oxide layer, and each one of the sacrificial layers has a thickness of 10 nm to 200 nm; the bitline material layers comprise silicon-on-insulator, and each one of the bitline material layers has a thickness of 10 nm to 100 nm.

In accordance with some embodiments, step of etching selectively the sacrificial units in the fin-shaped structure to obtain the suspended bitline comprising: etching selectively the sacrificial units; forming thermal oxide layers wrapped around the bitline units on surfaces of the bitline units by using a thermal oxidation process; and removing the thermal oxide layers to form a nanosheet having a cross-sectional shape of a rounded rectangle as the bitlines.

In accordance with some embodiments, the method further comprising a step of subjecting a thermal annealing process to the structure after the step of forming the bitlines.

In accordance with some embodiments, the thermal annealing process is performed in a hydrogen gas atmosphere at 800° C.-1200° C. for 5 minutes to 8 hours.

In accordance with some embodiments, both of the sacrificial layers and the bitline material layers have at least two layers; the step of forming the wordline electrode around the top electrode further comprise a step of forming a dielectric layer on the wordline electrode.

In accordance with some embodiments, the method further comprising a step of forming an isolation layer disposed on a surface of the substrate while forming the resistive layer wrapped around the bottom electrode.

As described above, the semiconductor device and the manufacturing method thereof have the following beneficial effects: the present invention has an ability to realize multi-layer staking in unit area, and improve integration level of the device, such that storage capacity in unit area is improved. The semiconductor device of the present invention has a structure without any gate tube, a better rectification characteristic and a resistance state distribution with small variability, such that the resistance distribution is more uniform.

BRIEF DESCRIPTION OF THE DRAWINGS

Exemplary embodiments will be more readily understood from the following detailed description when read in conjunction with the appended drawings, in which.

DETAILED DESCRIPTION

Figure 1:
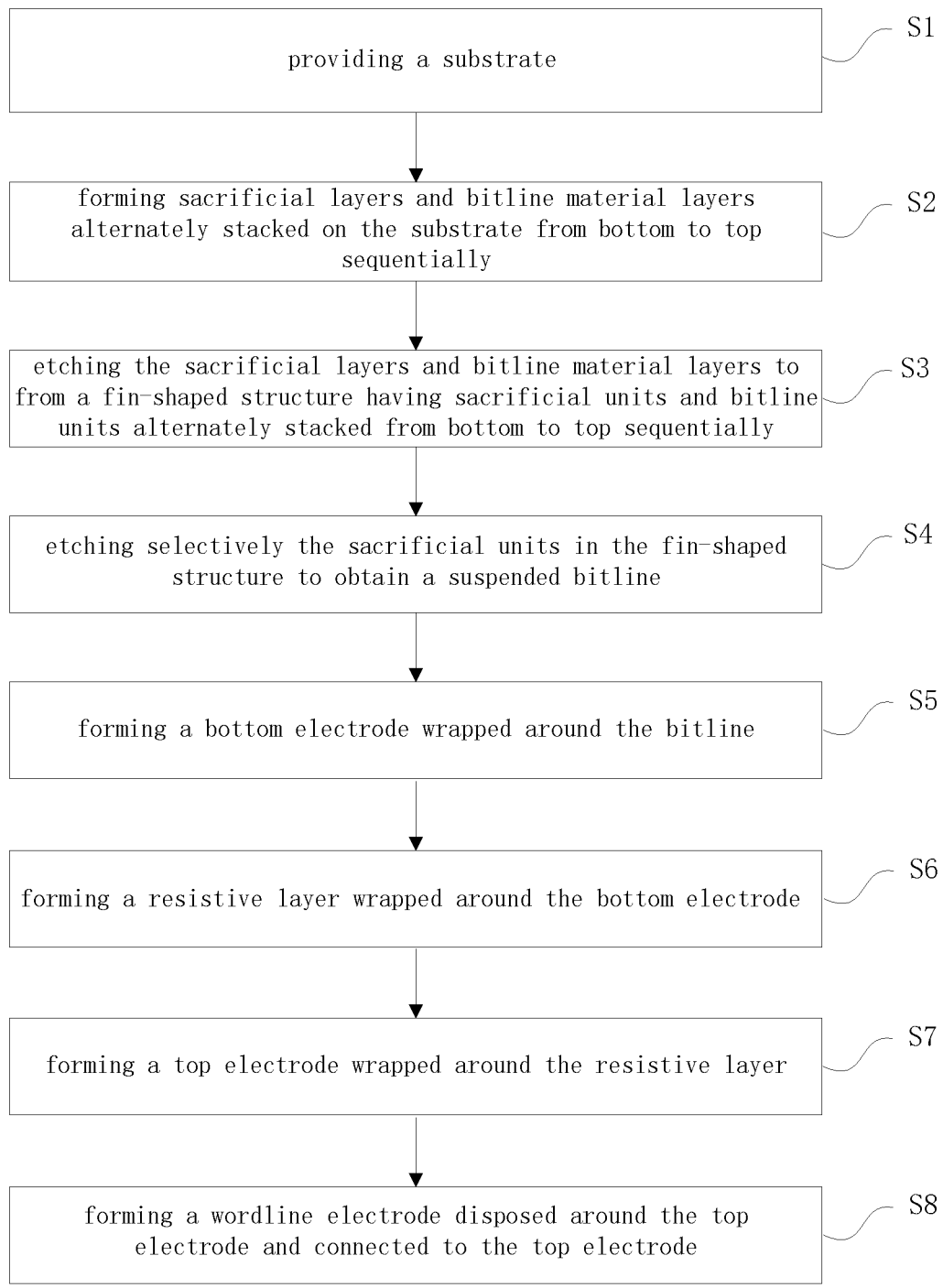
FIG. 1 depicts a flow chart of a manufacturing process of a semiconductor device according to some embodiments of the present disclosure.

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

Please refer to FIGS. 2 through 12. It should be noted that the illustrations provided in this embodiment merely illustrate the basic concept of the present invention in a schematic manner, and only the components related to the present invention are shown in the drawings, instead of the number and shape of components in actual implementation. Dimensional drawing, the actual type of implementation of each component type, number and proportion can be a random change, and its component layout can be more complicated.

1st Embodiment

As shown in FIG. 1, the present disclosure provides a manufacturing method of a semiconductor device, which comprises steps of:
1) providing a substrate;
2) forming sacrificial layers and bitline material layers alternately stacked on the substrate from bottom to top sequentially;
3) etching the sacrificial layers and the bitline material layers to from a fin-shaped structure having sacrificial units and bitline units alternately stacked from bottom to top sequentially;
4) etching selectively the sacrificial units in the fin-shaped structure to obtain a suspended bitline;
5) forming a bottom electrode wrapped around the bitline;
6) forming a resistive layer wrapped around the bottom electrode;
7) forming a top electrode wrapped around the resistive layer; and
8) forming a wordline electrode disposed around the top electrode and connected to the top electrode.

Figure 2:
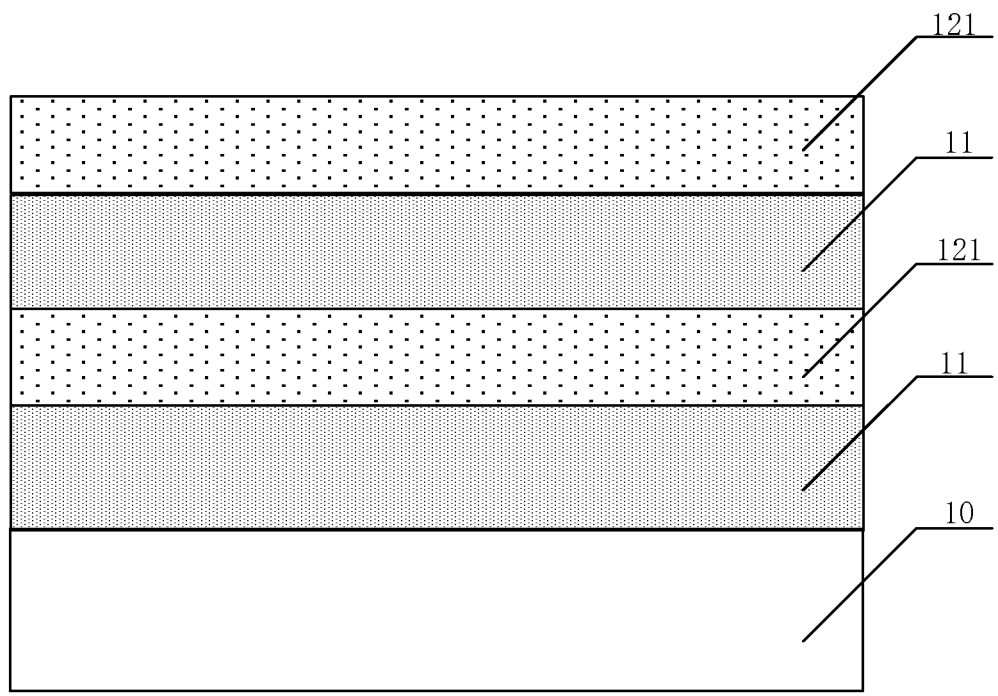
FIGS. 2-11 depict of cross-section diagrams of various stages of sequential manufacturing process of the semiconductor device according to some embodiments of the present disclosure.

In the step 1), please refer to step S1 in FIG. 1 and FIG. 2, a substrate 10 is provided.

For example, the substrate 10 may comprises, but is not limited to, a silicon (Si) substrate, a silicon carbide (SiC) substrate, or a silicon germanium (SiGe) substrate. In this preferred embodiment, the substrate 10 is the Si substrate.

In the step 2), please refer to step S2 in FIG. 1 and FIG. 2, sacrificial layers 11 and bitline material layers 121 are formed alternately stacked on the substrate 10 from bottom to top sequentially.

Figure 3:
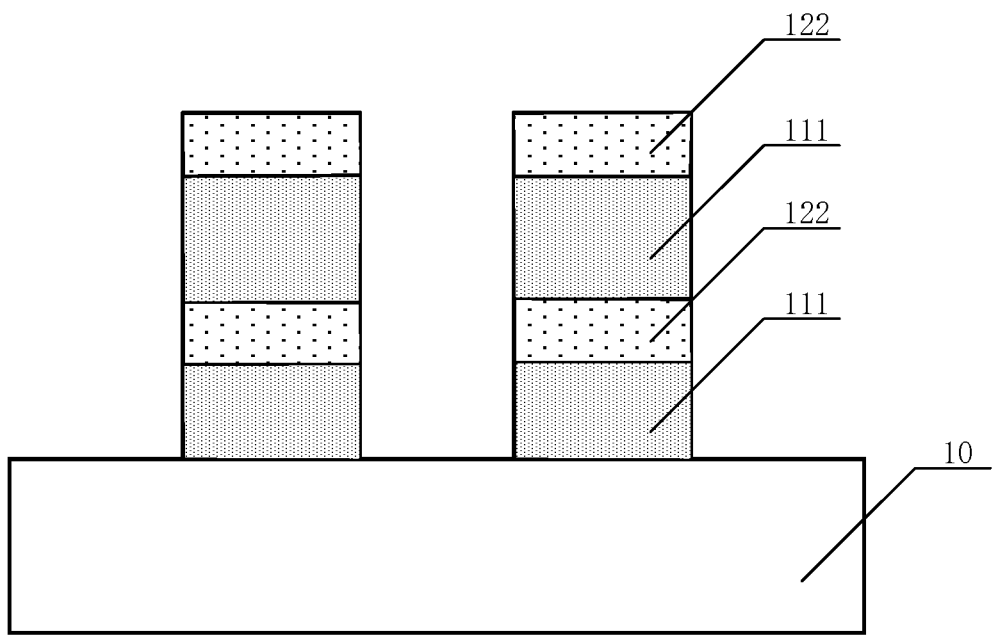

For example, the sacrificial layers 11 and the bitline material layers 121 may be formed alternately stacked on the substrate 10 from bottom to top sequentially by performing a chemical vapor deposition process; the sacrificial layers 11 may comprise a buried oxide layer (BOX); the material of the sacrificial layers 11 may comprise silicon dioxide; the material of the bitline material layers 121 may comprise silicon-on-insulator (SOI). The number of layers of the sacrificial layers 11 and the bitline material layers 121 may be arranged according to the actually requirement. FIG. 3 illustrates both of layers of the sacrificial layers 11 and the bitline material layers 121 have two layers as an example. Actual examples of the number of layers of the sacrificial layers 11 and the bitline material layers 121 are not limited.

For example, each one of the sacrificial layers 11 may have a thickness of 10 nm to 200 nm, such as 50 nm, 100 nm, 150 nm, etc.; each one of the bitline material layers 121 may have a thickness of 10 nm to 100 nm, such as 20 nm, 30 nm, 40 nm, 50 nm, 60 nm, 70 nm, 80 nm, 90 nm, etc.

In the step 3), please refer to step S3 in FIG. 1 and FIG. 3, the sacrificial layers 11 and the bitline material layers 121 are etched to from a fin-shaped structure having sacrificial units 111 and bitline units 122 alternately stacked from bottom to top sequentially.

For example, etching the sacrificial layers 11 and the bitline material layers 121 to from the fin-shaped structure by performing a lithography process and an etching process. The sacrificial units 111 are formed by etched sacrificial layers 11, and the bitline units 122 are formed by etched bitline material layers 121.

Figure 4:
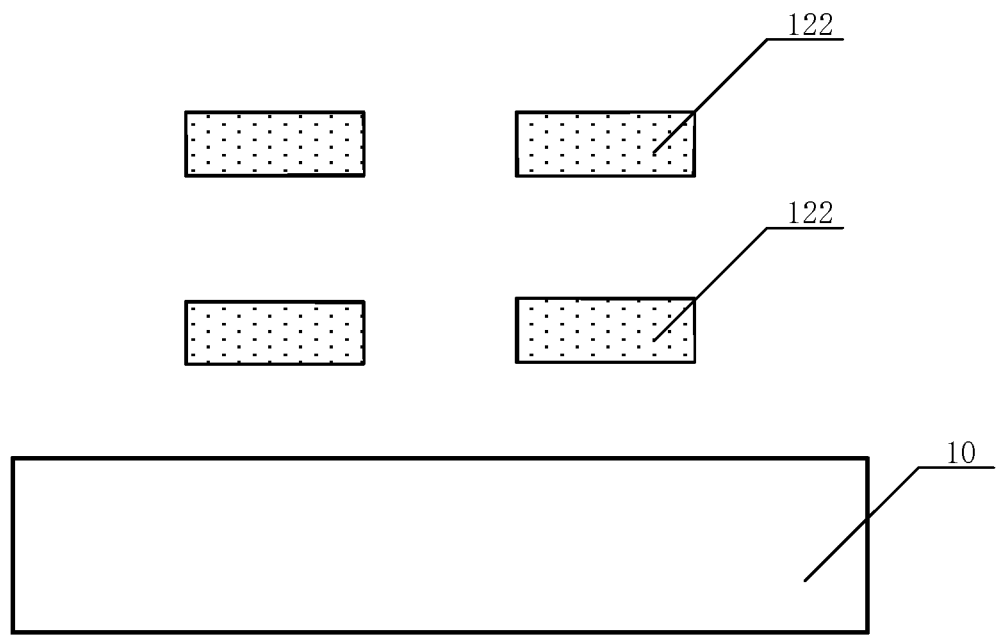
Figure 5:
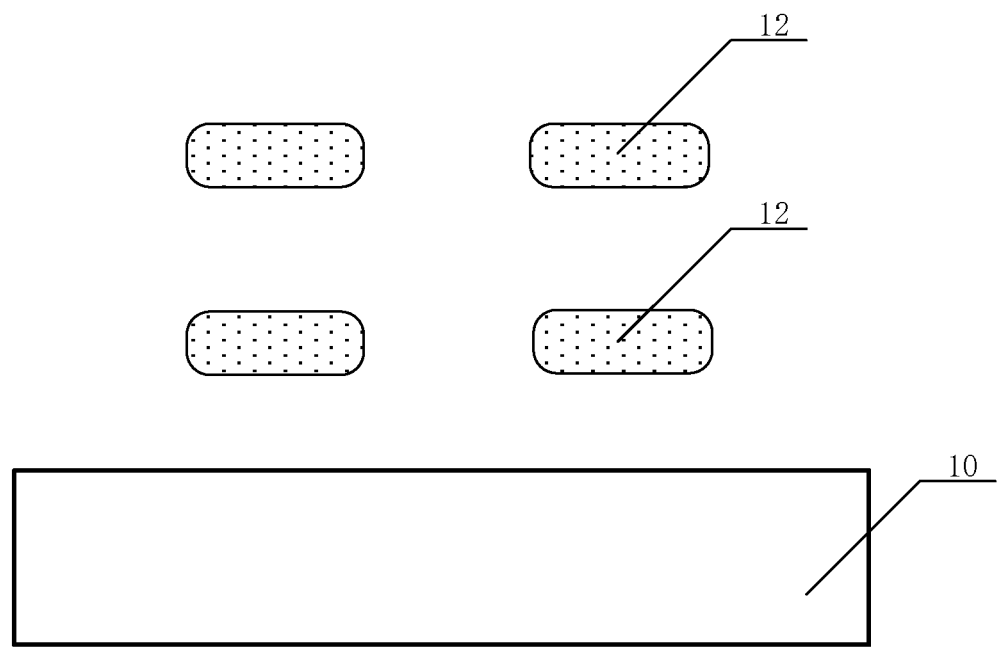

In the step 4), please refer to step S4 in FIG. 1 and FIGS. 4-5, the sacrificial units 111 in the fin-shaped structure are etched selectively to obtain a suspended bitline 12.

For example, the step 4) comprises following steps of:
4-1) etching selectively the sacrificial units 111; specifically, subjecting a wet etching to the sacrificial units 111 in the fin-shaped structure by using dilute hydrofluoric acid (DHF) to etch selectively the sacrificial units 111 as shown in FIG. 4;
4-2) forming thermal oxide layers (not shown) wrapped around the bitline units 122 on surfaces of the bitline units 122 by using a thermal oxidation process; and
4-3) removing the thermal oxide layers to form a nanosheet having a cross-sectional shape of a rounded rectangle as the bitlines 12 as shown in FIG. 5; specifically, subjecting a wet etching to the thermal oxide layers by using DHF to removing the thermal oxide layers.

For example, the method further comprises a step of subjecting a thermal annealing process to the structure after the step of forming the bitlines 12. Specifically, the thermal annealing process is performed to the structure obtained in step 4-3) in a hydrogen gas atmosphere at 800° C.-1200° C. for 5 minutes to 8 hours.

Figure 6:
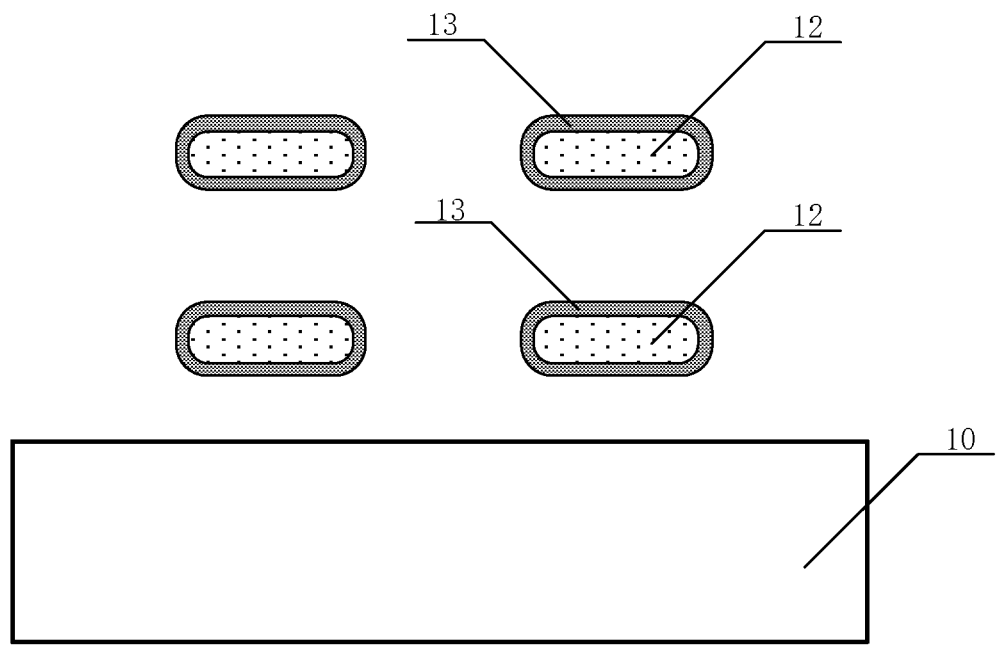

In the step 5), please refer to step S5 in FIG. 1 and FIG. 6, a bottom electrode 13 is formed to be wrapped around the bitline 12.

For example, a physical vapor deposition process, a chemical vapor deposition process, an atomic layer deposition process, or an epitaxial growth process may be performed to form the bottom electrode 13 wrapped around the bitline 12.

For example, the bottom electrode 13 may wrapped around outer surface of the bitline 12, the material of the bottom electrode 13 may comprise at least one of titanium nitride (TiN), tantalum nitride (TaN), tungsten (W) and platinum (Pt), and the bottom electrode 13 may have a thickness of 3 nm to 30 nm.

Figure 7:
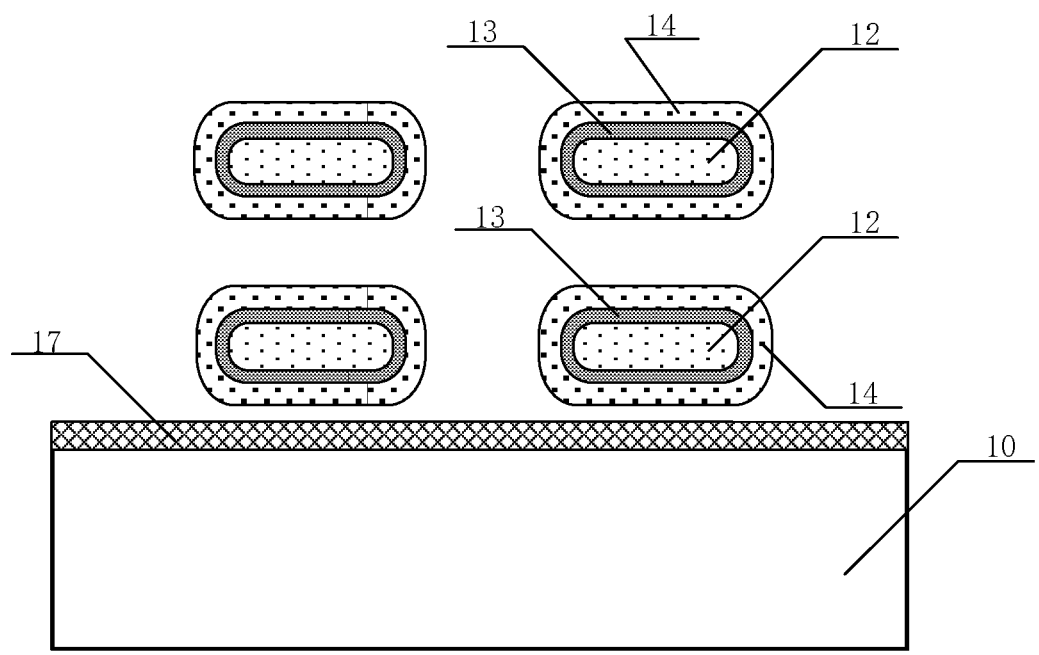

In the step 6), please refer to step S6 in FIG. 1 and FIG. 7, a resistive layer 14 is formed to be wrapped around the bottom electrode 13.

For example, a physical vapor deposition process, a chemical vapor deposition process, an atomic layer deposition process, or an epitaxial growth process may be performed to form the resistive layer 14 wrapped around the bottom electrode 13.

For example, the resistive layer 14 may be wrapped around an outer surface of the bottom electrode 13, the material of the resistive layer 14 may comprise at least one of hafnium oxide (HfO$_X$), tantalum oxide (TaO$_X$) and tungsten oxide (WO$_X$), and the resistive layer has a thickness of 30 nm to 100 nm.

For example, the method further comprise a step of forming an isolation layer 17 disposed on a surface of the substrate 10 while forming the resistive layer 14 wrapped around the bottom electrode 13. Specifically, a physical vapor deposition process, a chemical vapor deposition process, an atomic layer deposition process, or an epitaxial growth process etc. may be performed to form the isolation layer 17, the isolation layer 17 may be a buried oxide layer, and the material of the isolation layer 17 may be silicon dioxide (SiO$_2$).

Figure 8:
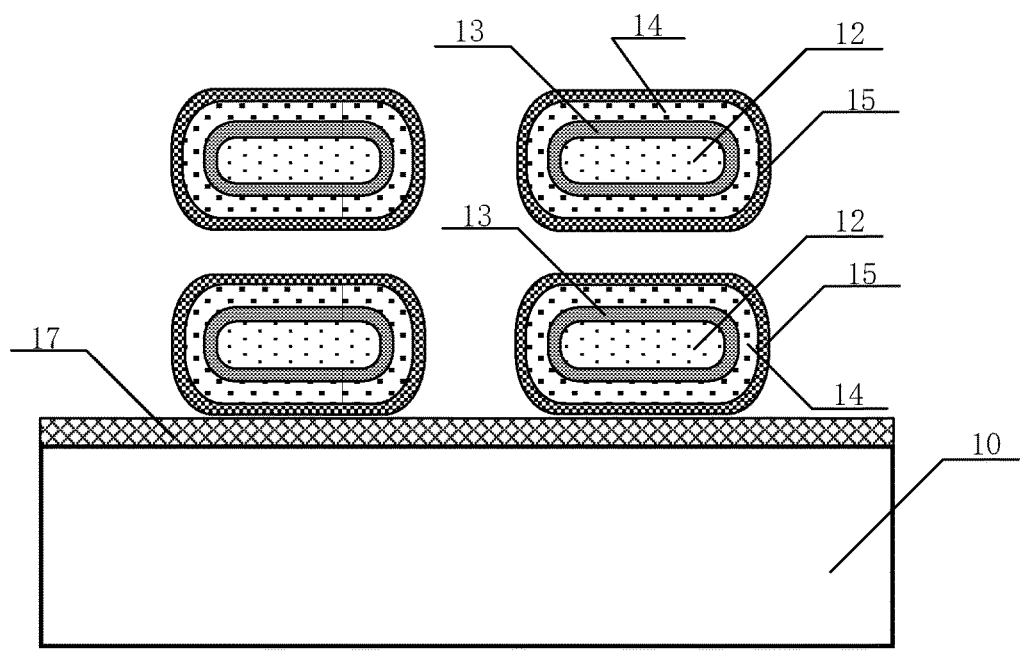

In the step 7), please refer to step S7 in FIG. 1 and FIG. 8, a top electrode 15 is formed to be wrapped around the resistive layer 14.

For example, a physical vapor deposition process, a chemical vapor deposition process, an atomic layer deposition process, or an epitaxial growth process may be performed to form the top electrode 15 wrapped around the resistive layer 14.

For example, the top electrode 15 may be formed to be wrapped around an outer surface of the resistive layer 14. The material of the top electrode 15 may comprise at least one of titanium nitride (TiN), tantalum nitride (TaN), tungsten (W) and platinum (Pt), and the top electrode 15 may have a thickness of 3 nm to 30 nm.

The bottom electrode 13, the resistive layer 14 and the top electrode 15 compose a variable resistance memory element.

In the step 8), please refer to step S8 in FIG. 1 and FIGS. 9-11, a wordline electrode 16 is formed around the top electrode 15 and to be connected to the top electrode 15.

Figure 9:
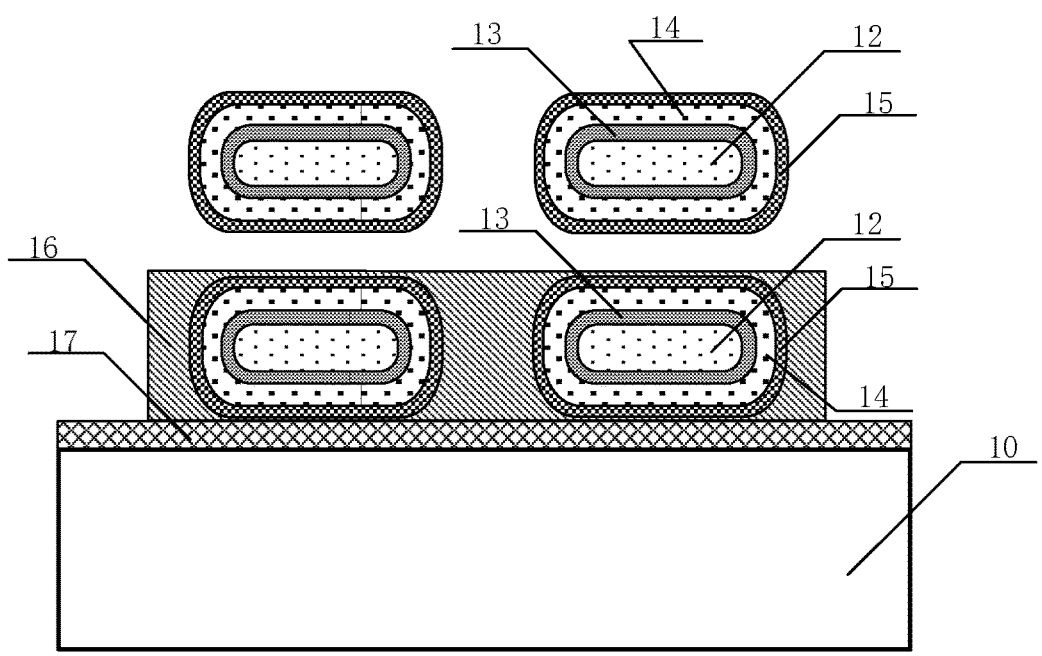
Figure 10:
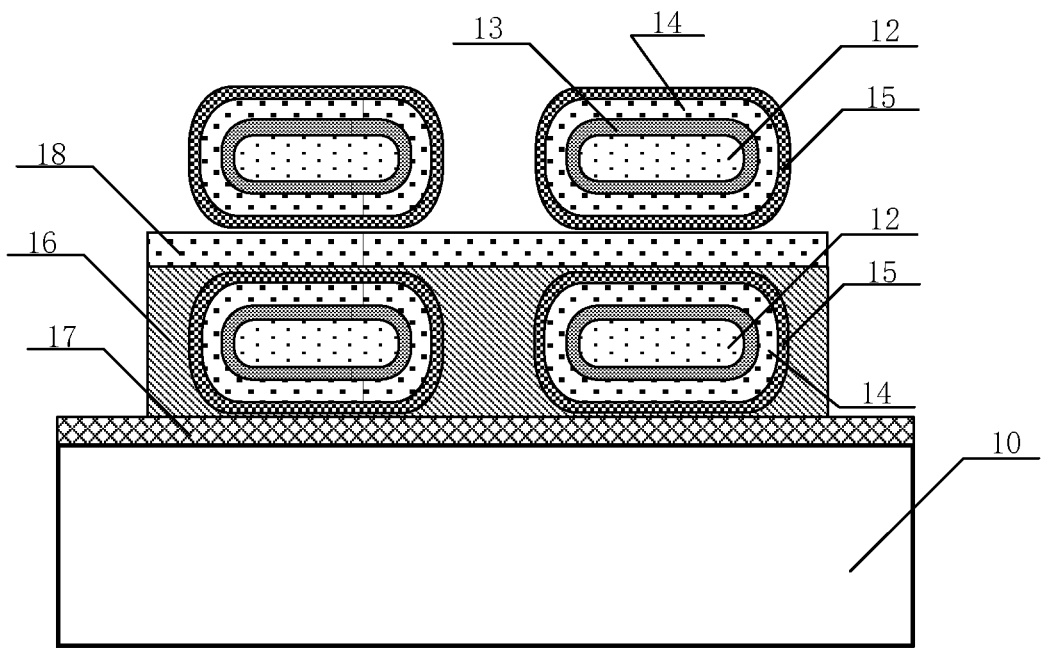
Figure 11:
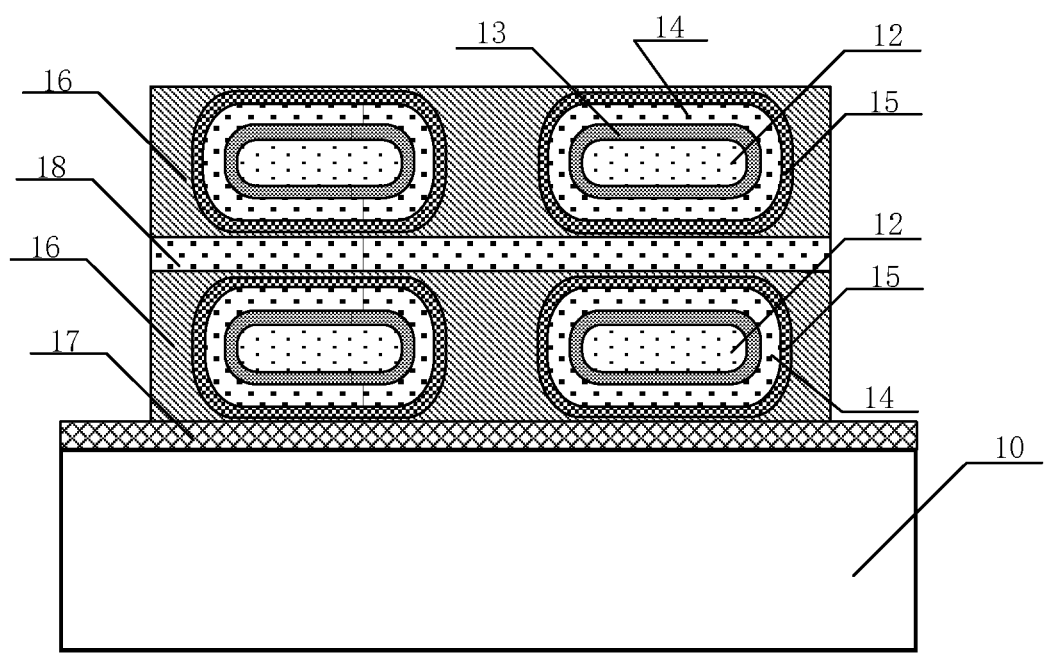

Take the bitline 12 stacked up on the substrate 10 comprising the two layers as an example, the step 8) comprises following steps of:

8-1) forming a lower layer of the wordline electrode 16 around a bottom layer of the top electrode 15, which is connected to the bottom layer of the top electrode 15 as shown in FIG. 9;

8-2) forming a dielectric layer 18 on an upper surface of the wordline electrode 16 formed in step 8-1) as shown in FIG. 10;

8-3) forming an upper layer of the wordline electrode 16 on an upper surface of the dielectric layer 18 and around a top layer of the top electrode 15, which is connected to the top layer of the top electrode 15 as shown in FIG. 11. In other words, the dielectric layer 18 is formed between two adjacent layers of the wordline electrode 16 to isolate the two adjacent layers of the wordline electrode 16.

For example, the material of the wordline electrode 16 may comprise at least one of titanium nitride (TiN), tantalum nitride (TaN), tungsten (W) and platinum (Pt), aluminum (Al), copper (Cu), argentum (Ag).

The variable resistance element, the bitline 12 at the inner side thereof and the wordline electrode 16 at the outer side thereof may compose a variable resistance memory unit.

Figure 12:
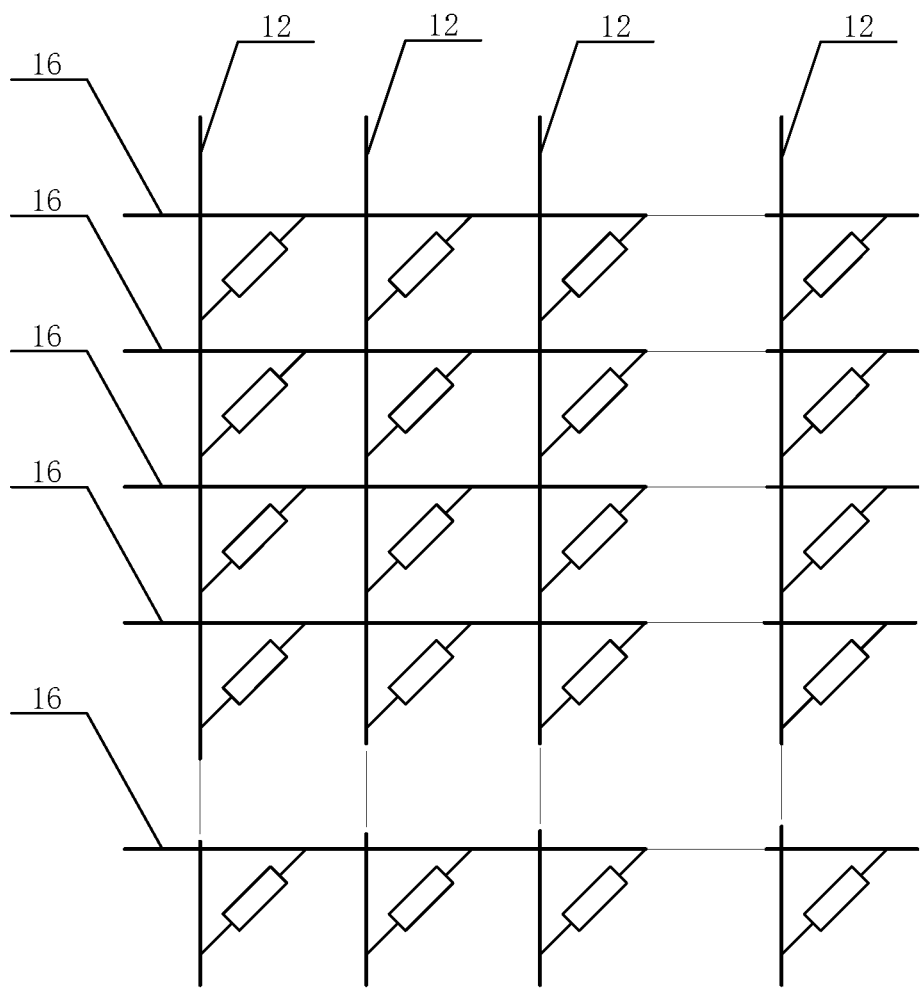
FIG. 12 depicts an equivalent circuit diagram of a semiconductor device according to some embodiments of the present disclosure

For example, the semiconductor device comprises a plurality of bitlines 12 spaced apart from each other and a plurality of wordline electrodes 16 spaced apart from each other, wherein the pluralities of wordline electrodes 16 are extended along an arranged orientation of the pluralities of bitlines 12, such that the variable resistance elements around the bitlines 12 are connected one by one in series. An equivalent circuit diagram of a semiconductor device according to some embodiments of the present disclosure is shown in FIG. 12.

2nd Embodiment

Please refer to FIG. 2 in conjunction with FIG. 11, the present invention further provides a semiconductor device, which comprise a substrate 10; a bitline 12, which is suspended on the substrate 10; a bottom electrode 13, which is wrapped around the bitline 12; a resistive layer 14, which is wrapped around the bottom electrode 13; a top electrode 15, which is wrapped around the resistive layer 14; and a wordline electrode 16, which is disposed around the top electrode 15 and is connected to the top electrode 15.

For example, the substrate 10 may comprises, but is not limited to, a silicon (Si) substrate, a silicon carbide (SiC) substrate, or a silicon germanium (SiGe) substrate. In this preferred embodiment, the substrate 10 is the Si substrate.

For example, the material of the bitline 12 may comprise silicon-on-insulator (SOI); the bitline 12 may have a thickness of 10 nm to 100 nm, such as 20 nm, 30 nm, 40 nm, 50 nm, 60 nm, 70 nm, 80 nm, 90 nm, etc.

For example, the bitline 12 may be a nanosheet.

For example, the bitline 12 may has a cross-sectional shape of a rounded rectangle (or a racetrack shape).

For example, the bottom electrode 13 may wrapped around outer surface of the bitline 12, the material of the bottom electrode 13 may comprise at least one of titanium nitride (TiN), tantalum nitride (TaN), tungsten (W) and platinum (Pt), and the bottom electrode 13 may have a thickness of 3 nm to 30 nm.

For example, the resistive layer 14 may be wrapped around an outer surface of the bottom electrode 13, the material of the resistive layer 14 may comprise at least one of hafnium oxide (HfO$_X$), tantalum oxide (TaO$_X$) and tungsten oxide (WO$_X$), and the resistive layer has a thickness of 30 nm to 100 nm.

For example, the top electrode 15 may be formed to be wrapped around an outer surface of the resistive layer 14. The material of the top electrode 15 may comprise at least one of titanium nitride (TiN), tantalum nitride (TaN), tungsten (W) and platinum (Pt), and the top electrode 15 may have a thickness of 3 nm to 30 nm.

For example, the bottom electrode 13 disposed between the wordline electrode 16 and the bitline 12, the resistive layer 14 and the top electrode 15 compose a variable resistance memory element, the variable resistance memory element, the bitline 12 at the inner side thereof and the wordline electrode 16 at the outer side thereof may compose a variable resistance memory unit; the semiconductor device comprises a plurality of bitlines 12 spaced apart from each other and a plurality of wordline electrodes 16 spaced apart from each other, wherein the pluralities of wordline electrodes 16 are extended along an arranged orientation of the pluralities of bitlines 12, such that the variable resistance elements around the bitlines 12 are connected one by one in series. An equivalent circuit diagram of a semiconductor device according to some embodiments of the present disclosure is shown in FIG. 12.

For example, the semiconductor device comprises at least two variable resistance memory units stacked up on the substrate 10, and a gap between the two adjacent variable resistance memory units. FIG. 11 illustrates the semiconductor device comprising two variable resistance memory units stacked up on the substrate 10, but actual examples of the number of the variable resistance memory units are not limited.

For example, the semiconductor device further comprises a dielectric layer 18 disposed between the variable resistance memory units stacked up on the substrate 10, i.e. the dielectric layer 18 is formed between two adjacent layers of the wordline electrode 16.

For example, the semiconductor device further comprises an isolation layer 17 disposed on a surface of the substrate 10, and between the variable resistance memory unit and the substrate 10, i.e. the isolation layer 17 is disposed between the bottom layer of the wordline electrode 16 and the substrate 10. The isolation layer 17 may be a buried oxide layer, and the material of the isolation layer 17 may be silicon dioxide ($SiO_2$).

As mention above, the invention provides a semiconductor device and a manufacturing method thereof. The semiconductor device comprises a substrate; a bitline, suspended on the substrate; a bottom electrode, wrapped all around the bitline; a resistive layer, wrapped all around the bottom electrode; a top electrode, wrapped all around the resistive layer; a wordline electrode, disposed around the top electrode and connected with the top electrode. The present invention has ability to realize multi-layer staking in unit area, and improve integration level of the device, such that storage capacity in unit area is improved. The semiconductor device of the present invention has a structure without any gate tube, a better rectification characteristic and a resistance state distribution with small variability, such that the resistance distribution is more uniform.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention (s), and their equivalents, that are protected thereby. In all instances, the scope of such claims shall be considered on their own merits in light of this disclosure, but should not be constrained by the headings herein.

What is claimed is:

1. A semiconductor device, comprising:
a substrate;
a bitline, suspended on the substrate;
a bottom electrode, wrapped around the bitline;
a resistive layer, wrapped around the bottom electrode;
a top electrode, wrapped around the resistive layer; and
a wordline electrode, disposed around the top electrode and connected to the top electrode.

2. The semiconductor device according to claim 1, wherein the bitline is a nanosheet.

3. The semiconductor device according to claim 1, wherein the material of the bitline comprises silicon-on-insulator, and the bitline has a thickness of 10 nm to 100 nm.

4. The semiconductor device according to claim 1, wherein the material of the bottom electrode comprises at least one of titanium nitride (TiN), tantalum nitride (TaN), tungsten (W) and platinum (Pt), and the bottom electrode has a thickness of 3 nm to 30 nm.

5. The semiconductor device according to claim 1, wherein the material of the resistive layer comprises at least one of hafnium oxide ($HfO_x$), tantalum oxide ($TaO_x$) and tungsten oxide ($WO_x$), and the resistive layer has a thickness of 30 nm to 100 nm.

6. The semiconductor device according to claim 1, wherein the bitline has a cross-sectional shape of a rounded rectangle.

7. The semiconductor device according to claim 1, wherein the bottom electrode, the resistive layer and the top electrode disposed between the wordline electrode and the bitline compose a variable resistance element, wherein the variable resistance element, the bitline at the inner side thereof and the wordline electrode at the outer side thereof compose a variable resistance memory unit; the semiconductor device comprises a plurality of bitlines spaced apart from each other and a plurality of wordline electrodes spaced apart from each other, wherein the pluralities of wordline electrodes are extended along an arranged orientation of the pluralities of bitlines, such that the variable resistance elements around the bitlines are connected one by one in series.

8. The semiconductor device according to claim 5, wherein the material of the top electrode comprises at least one of titanium nitride (TiN), tantalum nitride (TaN), tungsten (W) and platinum (Pt), and the top electrode has a thickness of 3 nm to 30 nm.

9. The semiconductor device according to claim 7, wherein the semiconductor device comprises at least two variable resistance memory units stacked up on the substrate, and a gap between the two adjacent variable resistance memory units.

10. The semiconductor device according to claim 7, wherein the semiconductor device further comprises an isolation layer disposed on a surface of the substrate and between the variable resistance memory unit and the substrate.

11. The semiconductor device according to claim 9, wherein the semiconductor device further comprises a dielectric layer disposed between the variable resistance memory units stacked up on the substrate.

12. A manufacturing method of the semiconductor device, comprising steps of:
provide a substrate;
forming sacrificial layers and bitline material layers alternately stacked on the substrate from bottom to top sequentially;
etching the sacrificial layers and the bitline material layers to from a fin-shaped structure having sacrificial units and bitline units alternately stacked from bottom to top sequentially;
etching selectively the sacrificial units in the fin-shaped structure to obtain a suspended bitline;
forming a bottom electrode wrapped around the bitline;
forming a resistive layer wrapped around the bottom electrode;
forming a top electrode wrapped around the resistive layer; and
forming a wordline electrode disposed around the top electrode and connected to the top electrode.

13. The manufacturing method according to claim 12, wherein the sacrificial layers comprise a buried oxide layer, and each one of the sacrificial layers has a thickness of 10 nm to 200 nm;
the bitline material layers comprise silicon-on-insulator, and each one of the bitline material layers has a thickness of 10 nm to 100 nm.

14. The manufacturing method according to claim 12, wherein step of etching selectively the sacrificial units in the fin-shaped structure to obtain the suspended bitline comprising:
etching selectively the sacrificial units;
forming thermal oxide layers wrapped around the bitline units on surfaces of the bitline units by using a thermal oxidation process; and
removing the thermal oxide layers to form a nanosheet having a cross-sectional shape of a rounded rectangle as the bitlines.

15. The manufacturing method according to claim 14, further comprising a step of subjecting a thermal annealing process to the structure after the step of forming the bitlines.

16. The manufacturing method according to claim 12, wherein both of the sacrificial layers and the bitline material layers have at least two layers; the step of forming the wordline electrode around the top electrode further comprise a step of forming a dielectric layer on the wordline electrode.

17. The manufacturing method according to claim 12, further comprising a step of forming an isolation layer disposed on a surface of the substrate while forming the resistive layer wrapped around the bottom electrode.

18. The manufacturing method according to claim 17, wherein the thermal annealing process is performed in a hydrogen gas atmosphere at 800° C.-1200° C. for 5 minutes to 8 hours.

* * * * *